United States Patent [19]

Racanelli et al.

[11] Patent Number: 5,719,081
[45] Date of Patent: Feb. 17, 1998

[54] FABRICATION METHOD FOR A SEMICONDUCTOR DEVICE ON A SEMICONDUCTOR ON INSULATOR SUBSTRATE USING A TWO STAGE THRESHOLD ADJUST IMPLANT

[75] Inventors: Marco Racanelli; Wen-Ling M. Huang, both of Phoenix, Ariz.; Bor-Yuan C. Hwang, Alpharetta, Ga.; Juergen A. Foerstner, Mesa, Ariz.

[73] Assignee: Motorola, Inc., Schaumburg, Ill.

[21] Appl. No.: 552,656

[22] Filed: Nov. 3, 1995

[51] Int. Cl.$^6$ .................................................. H01L 21/336
[52] U.S. Cl. ............................ 438/290; 438/149; 438/549
[58] Field of Search ..................................... 437/21, 30, 37, 437/45, 154

[56] References Cited

U.S. PATENT DOCUMENTS

| | | | |
|---|---|---|---|
| 4,402,761 | 9/1983 | Feist | 437/45 |
| 4,649,629 | 3/1987 | Miller et al. | 437/45 |
| 4,845,047 | 7/1989 | Holloway et al. | 437/45 |
| 4,948,745 | 8/1990 | Pfiester et al. | 437/44 |
| 5,028,552 | 7/1991 | Ushiku | 437/45 |
| 5,081,052 | 1/1992 | Kobayashi et al. | 437/45 |
| 5,091,328 | 2/1992 | Miller | 437/45 |
| 5,185,280 | 2/1993 | Houston et al. | 437/21 |
| 5,248,627 | 9/1993 | Williams | 437/45 |
| 5,283,200 | 2/1994 | Okamoto | 437/45 |
| 5,384,279 | 1/1995 | Stolmeijer et al. | 437/45 |

*Primary Examiner*—Chandra Chaudhari
*Attorney, Agent, or Firm*—Rennie William Dover

[57] ABSTRACT

A two stage threshold adjust implantation process is performed after field oxidation to avoid the effects of dopant redistribution and segregation. At any of several steps in a manufacturing process, only routine implant energy and dose adjustments are required to create a first and a second dopant profile (110, 120) that result in the reduction of edge leakage and threshold voltage sensitivity to device layer thickness of a semiconductor device on a semiconductor on insulator substrate.

20 Claims, 1 Drawing Sheet

FABRICATION METHOD FOR A SEMICONDUCTOR DEVICE ON A SEMICONDUCTOR ON INSULATOR SUBSTRATE USING A TWO STAGE THRESHOLD ADJUST IMPLANT

CROSS-REFERENCE TO RELATED APPLICATIONS

The present application is related to U.S. patent application Ser. No. 08/423,614, entitled "METHOD OF ADJUSTING A THRESHOLD VOLTAGE FOR A SEMICONDUCTOR DEVICE FABRICATED ON A SEMICONDUCTOR ON INSULATOR SUBSTRATE", and now U.S. Pat. No. 5,532,175, filed on Apr. 17, 1995, by Marco Racanelli et al. and assigned to the same assignee, Motorola, Inc.

BACKGROUND OF THE INVENTION

This invention relates, in general, to a method of fabricating a semiconductor device, and more particularly, to a method of fabricating a semiconductor device on a silicon or semiconductor on insulator (SOI) substrate where the device has reduced edge leakage and threshold voltage ($V_t$) sensitivity to device layer thickness.

Semiconductor devices using SOI technology are built on a substrate that comprises a silicon device layer overlying a buried insulator layer which insulates the device layer from a bulk silicon substrate. Use of SOI technology can provide several advantages over conventional bulk silicon technology in the manufacture of metal oxide semiconductor (MOS) integrated circuits. These advantages include reduced processing steps, elimination of complimentary MOS (CMOS) circuit latchup, higher transistor density, increased speed through the reduction of parasitic capacitances, improved device isolation, and superior radiation hardness. However, conventional MOS devices fabricated in SOI substrates suffer from two common problems. The first of these problems is edge leakage that results, in part, from dopant segregation and redistribution during field oxidation. The second problem is the sensitivity of device threshold voltage to device or silicon layer thickness.

Typically, in both bulk silicon and SOI, a single $V_t$ adjust implant is performed after field oxidation to set device $V_t$. In addition, a field implant can be performed before field oxidation to reduce leakage along a device edge. While dopant redistribution and segregation occur in both, performance in an SOI device is degraded much more significantly than in a bulk silicon device due to the very thin silicon or device layer of an SOI substrate which renders it more susceptible to dopant depletion. This is particularly true in those regions of the device layer adjacent to field oxide regions where the effects of dopant redistribution and segregation are the greatest during field oxidation. Thus a need exists to solve the problems of dopant redistribution and segregation that reduce net dopant concentration and result in device leakage.

Recently, the use of a single $V_t$ implantation after field oxidation has been proposed as a solution to these problems on the theory that redistribution and segregation will not occur without the high temperature field oxidation step. An implant performed after field oxidation will require a different energy and dose than the pre-field oxidation implant to achieve the desired dopant profile. It has been found that these required changes can result in poor dopant profiles in channel regions, which in turn leads to $V_t$ variations between devices. In addition, any increase in the dopant concentration can result in higher threshold voltages which translate into undesirable higher operating voltages.

Accordingly, a need exists for better methods of adjusting the threshold voltage and reducing device leakage of a semiconductor device fabricated on a SOI substrate.

Therefore, it is an objective of the present invention to provide an improved method of adjusting threshold voltage for a semiconductor device fabricated on a SOI substrate that will result in reduced threshold voltage variation from device to device.

It is also an objective of the present invention to fabricate a semiconductor device on a SOI substrate that has reduced edge leakage.

Finally, it is an objective of the present invention that the new method provide these benefits while maintaining the advantages and processing simplicity of SOI device fabrication.

DETAILED DESCRIPTION OF THE DRAWINGS

Figure 1:
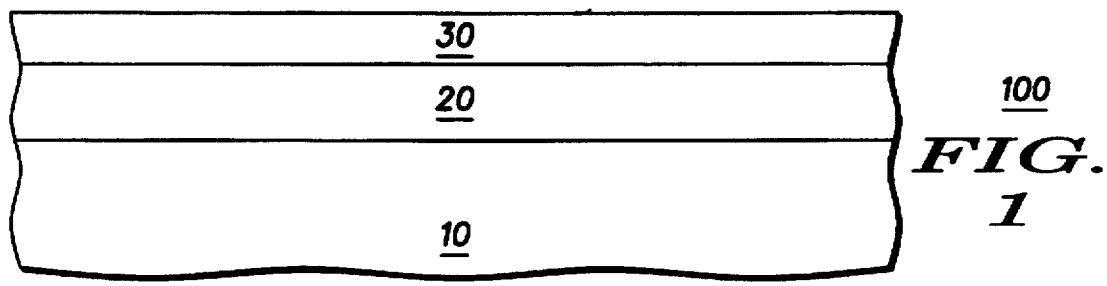
FIG. 1 is a simplified cross-sectional view of a silicon on insulator substrate.

FIG. 1 illustrates a cross-sectional view of a silicon on insulator (SOI) substrate 100 such as would be used in accordance with the present invention. SOI substrate 100 comprises a thin semiconductor device layer 30, silicon in this embodiment, that overlies buried insulation layer 20, silicon oxide herein, which overlies a bulk substrate 10. SOI substrate 100 can be formed using any of the conventional processes known in the art. For example, substrate 100 can be formed by oxygen implantation, known as SIMOX or separation by implanted oxygen or alternatively by direct wafer bonding and thinning. Typically, device layer 30 is approximately 100 nanometers (nm) thick, but can be thicker or thinner to conform to specific device requirements. For example layer 30 can be in the range of approximately 50 to 1000 nm thick. Oxide insulation layer 20 is typically 400 nm thick. Substrate 10 can be a standard silicon wafer having an initial thickness that is a function of wafer diameter.

Figure 2:
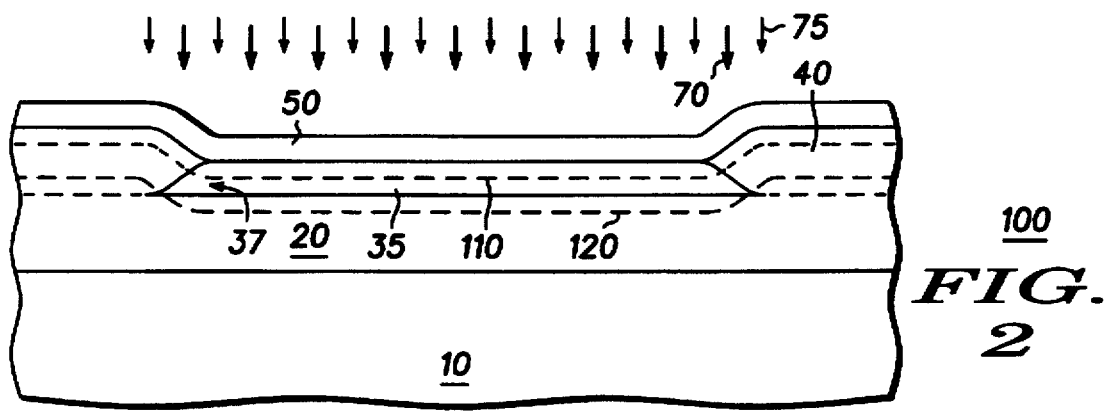
FIG. 2 is a simplified cross-sectional view of a MOS transistor in an early stage of fabrication that incorporates an embodiment of the present invention.

FIG. 2 illustrates a cross-sectional view of a MOS transistor during fabrication. Silicon layer 30, from FIG. 1, is shown after active region 35 has been defined between field oxide regions 40. Field oxide regions 40 can be formed by conventional oxidation techniques known in the art to provide electrical isolation of active areas. For example, field oxide regions 40 can be formed using local oxidation of silicon (LOCOS) or any of the LOCOS derivative processes such as poly buffered LOCOS (PBL).

Referring again to FIG. 2, a sacrificial oxide layer 50 has been formed over field oxide regions 40 and active area 35. Typically sacrificial layer 50 is formed by thermal oxidation to insure the formation of good quality gate oxide, however any other process capable of forming a uniform layer of a silicon oxide can be employed. A thickness of layer 50 between approximately 30 and 300 nm is typical. In this embodiment, a 150 nm layer is employed.

A first threshold adjust implant and a second threshold voltage adjust implant are illustrated in FIG. 2 as arrows 70 and 75 respectively. For an NMOS device, first and second $V_t$ implants will use a P-type dopant, such as boron. First $V_t$ adjust implant 70 is tailored to form a first dopant profile which places the peak or maximum dopant concentration in a portion 37 of active area 35 adjacent field oxide regions 40 as indicated by dashed line 120. Portion 37 of active region 35 is a continuously narrowing portion of active region 35 between field oxide regions 40 and insulation layer 20. For an active area 35 that is 100 nm thick having an overlying sacrificial oxide layer 50 that is 150 nm thick, a boron implant performed with a first dose of approximately 5E11 to 1E13 atoms per centimeter squared ($cm^2$) at a first implant energy of approximately 90 KeV (electron volts×1000) can be expected to yield the peak or maximum dopant concentration profile indicated by line 120.

Second $V_t$ adjust implant 75 is tailored to form a second dopant profile which places the peak dopant concentration in the position indicated by dashed line 110. In contrast with line 120, maximum dopant concentration profile 110 places dopant at close to the top of active area 35 to achieve a desired channel doping. Thus, for an active area 35 that is 100 nm thick having an overlying sacrificial oxide layer 50 that is 150 nm thick, a boron implant performed with a second dose of approximately 5E11 to 1E13 atoms per $cm^2$ at a second implant energy of approximately 45 KeV can be expected to yield the maximum dopant concentration profile indicated by line 110. It is well known that the actual implant energy and dose used are not only dependent upon the thickness of active area 35 and sacrificial layer 50 but also upon the nature of the device being fabricated and the performance requirements of that device. Therefore the actual dose ranges and implant energies given are for illustration purposes only. Specific values of dose and implant energy for a specific application are readily determined by one of ordinary skill in the art.

Figure 3:
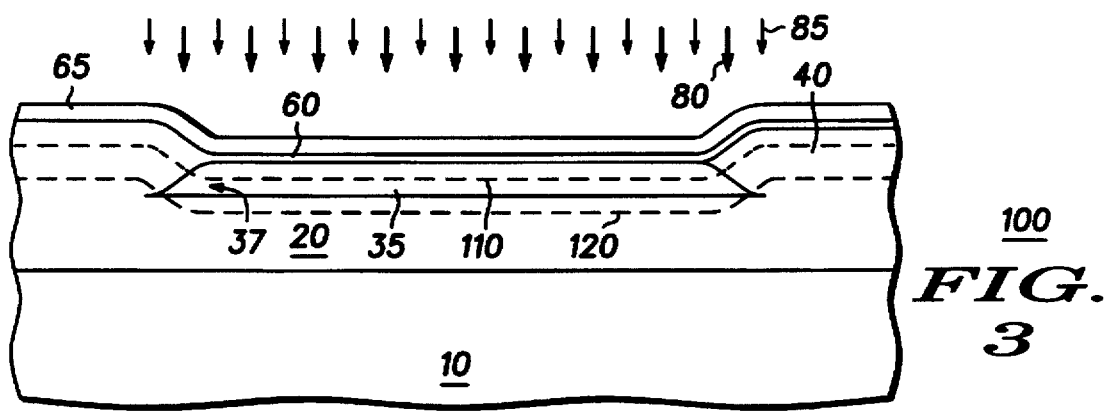
FIG. 3 is a simplified cross-sectional view of a MOS transistor in an early stage of fabrication that incorporates another embodiment of the present invention.

Turning now to FIG. 3, another cross-sectional view of a MOS transistor during fabrication in which another embodiment of the present invention is illustrated. Gate oxide layer 60 and polysilicon layer 65 have been formed, using conventional process methods, overlying active area 35. Gate oxide layer 60 is typically a thermally grown oxide layer having a thickness between approximately 5 and 40 nm with approximately 10 nm being a typical thickness for a high performance device. Polysilicon layer 65 will be subsequently patterned to form a first portion of a gate electrode and is typically deposited using a low pressure chemical vapor deposition process to a thickness in the range of approximately 20 to 400 nm with approximately 50 nm being a typical thickness.

A first $V_t$ adjust implant and a second $V_t$ adjust implant are illustrated in FIG. 3 as arrows 80 and 85 respectively. As in the case of the first embodiment discussed above, boron is the typical P-type dopant used. As this embodiment requires implantation through polysilicon layer 65 and oxide layer 60, as compared to sacrificial layer 50 (FIG. 2) of the first embodiment, different energies and implant doses are required. Thus first $V_t$ adjust implant 80 would require a first implant dose of approximately 5E11 to 1E13 atoms per $cm^2$ at a first implant energy of approximately 80 KeV to form a first dopant profile with a peak dopant concentration in portion 37 as indicated by dashed line 120. For second $V_t$ adjust implant 85, a second implant dose of between approximately 5E11 and 1E13 atoms per $cm^2$ at a second implant energy of approximately 20 KeV is required by the structure indicated to form a second dopant profile with a peak dopant concentration positioned as indicated by dashed line 110. As was the case for the previous embodiment, the actual dose ranges and implant energies given are for illustration purposes only. Specific values of dose and implant energy for a specific application are readily determined by one of ordinary skill in the art.

Figure 4:
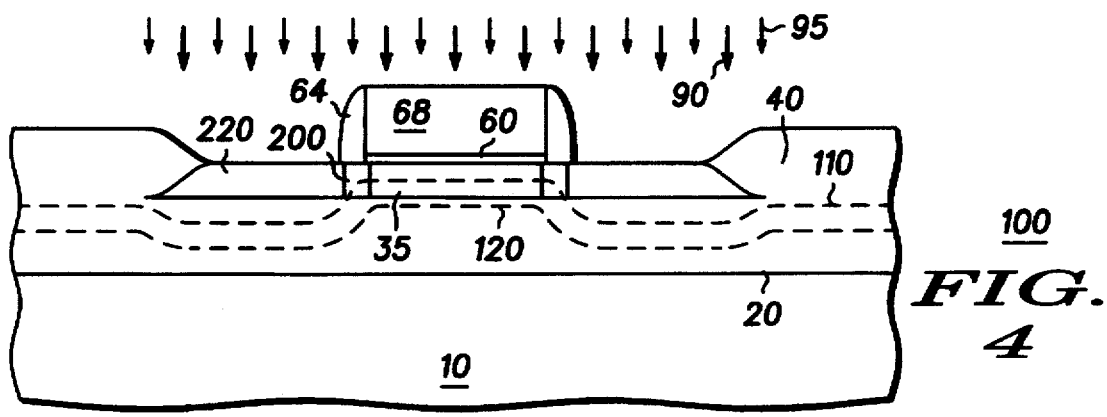
FIG. 4 is a simplified cross-sectional view of a MOS transistor in a later stage of fabrication that incorporates still another embodiment of the present invention.

FIG. 4 is another cross-sectional view of a MOS transistor during fabrication in which still another embodiment of the present invention is illustrated. Gate electrode 68 is overlying gate oxide layer 60 and patterned to cover only a central portion of active area 35. Typically, gate electrode 68 comprises a polysilicon layer between approximately 200 and 500 nm, with 300 nm being preferred in the embodiment shown. Gate oxide layer 60 is typically between approximately 5 and 400 nm, with 10 nm being preferred in the embodiment shown. A lightly doped drain (LDD) implant has been performed prior to the formation of sidewall spacers 64 to form LDD regions 200 self-aligned to electrode 68. In addition, a source/drain (S/D) implant has been performed after the formation of sidewall spacers 64 to form S/D regions 220 which are self-aligned to sidewall spacers 64. For the NMOS device discussed in the previous embodiments, the LDD implant would use an N-type dopant such as phosphorus with a dose of between approximately 1E13 and 1E15 atoms per $cm^2$ at an energy of approximately 45 KeV. The S/D implant would also use phosphorus as a dopant, but at a dose of between approximately 1E15 and 1E16 atoms per $cm^2$ and at an energy of approximately 40 KeV.

A first $V_t$ adjust implant and a second $V_t$ adjust implant are illustrated in FIG. 4 as arrows 90 and 95 respectively. As in the case of the previous embodiments, boron is again the typical P-type dopant used. In addition, as the structure through which implants 90 and 95 are changed from previous embodiments, the implant dose and energy are also modified. Thus, first $V_t$ adjust implant 90 would require a first implant dose of approximately 5E11 to 1E13 atoms per $cm^2$ at a first implant energy of approximately 160 KeV to form a first dopant profile with a peak dopant concentration as indicated by dashed line 120. For second $V_t$ adjust implant 95, a second implant dose of between approximately 5E11 and 1E13 atoms per $cm^2$ at a second implant energy of approximately 100 KeV is required by the structure indicated to form a second dopant profile with a peak dopant concentration positioned as indicated by dashed line 110.

In the embodiment of FIG. 4, both first and second $V_t$ adjust implants (90, 95) are delivered into buried insulation layer 20, under S/D regions 220. Therefore, implants 90 and 95 do not affect device performance. It will be understood that the cross-sectional view of FIG. 4 is taken to show the structure of gate electrode 68 and S/D regions 220. It will also be understood that a cross-sectional view of the embodiment of FIG. 4 taken orthogonal to the view illustrated would appear essentially identical to the view of FIG. 3, wherein only the thickness of layer 65 in the embodiment of FIG. 3 would be changed. Thus it is understood that dopant profile 120 provides a dopant concentration in a portion 37 of the embodiment of FIG. 4 that is essentially identical to portion 37 indicated in FIG. 3 for the embodiment of FIG. 3.

In each of the embodiments discussed, first and second threshold voltage adjust implants are performed to tailor the dopant profile in the device layer. The result is a dopant profile in active area 35 that is both controllable and reproducible. Since the higher energy implant positions dopant in those regions of active area 35 that are the thinnest and are closest to field oxide regions, leakage is reduced or eliminated. And as the lower energy implant creates an ideal dopant profile in active area 35 for a channel region, devices have consistently the same threshold voltage across a wafer and wafer to wafer.

For ease of explanation and understanding, all embodiments discussed have been consistent with the fabrication of an NMOS transistor. It should be realized, however, that the present invention is not limited to NMOS transistors. PMOS and CMOS devices can also benefit from the present invention. For example, in the embodiment of FIG. 1, a PMOS transistor would require a first $V_t$ adjust implant with phosphorus at a dose of between 5E11 and 1E13 atoms per $cm^2$ and an energy of 220 KeV. A second phosphorus $V_t$ adjust implant for a PMOS device would require a dose of between approximately 5E11 to 1E13 atoms per $cm^2$ at an energy of 110 KeV. Similarly, implant doses and energies can be determined for the other embodiments or dopants discussed where PMOS or CMOS circuitry is fabricated. For example, arsenic can be used for $V_t$ adjust implantation of PMOS devices or p-channel CMOS devices rather than phosphorus. It should also be realized that in each embodiment, it may be necessary to use an implant mask to prevent implantation into some areas. For example, in the CMOS embodiment of FIG. 4, a photoresist layer (not shown) can be used to mask PMOS regions while NMOS threshold voltage adjust implants are performed. An alternative photoresist layer (not shown) would then be required to serve as an implant mask for NMOS regions while PMOS threshold voltage adjust implants are performed.

In addition, it will be realized that the embodiment of FIG. 4 can require less masking steps than either of the first two embodiments in the fabrication of CMOS devices. This results from the requirement to provide an implant mask to protect the PMOS region while the NMOS implants are performed and the NMOS region when the PMOS implant is performed in those two embodiments. The embodiment of FIG. 4, however can perform the threshold adjust implants utilizing the same implant mask required for S/D implantation.

Finally, other variations that are within the scope of the present invention include using different elements for device layer 30 and insulation layer 20 of SOI substrate 100. For instance, other insulators including sapphire can be substituted for layer 20 to form silicon on sapphire substrate 10. Alternatively, other semiconductors such as gallium arsenide or indium phosphide can be substituted for layer 30 to form semiconductor on insulator (SOI) substrate 100. Additional variations of the present invention include interchanging the processing order of S/D implants and threshold voltage adjustment implants. Furthermore, the semiconductor manufacturing processes embodied in the present invention can also be used to produce MESFET and BiCMOS devices by simple variations that are easily discernible.

Therefore, in accordance with the present invention, it is apparent there has been provided better methods for adjusting the threshold voltage for a semiconductor device fabricated on a semiconductor on insulator substrate than those of the prior art. The present invention reduces threshold voltage adjustment dopant diffusion resulting from subsequent high temperature processing by performing the threshold voltage adjustment implant after the high temperature oxidation step required to form active area 35. Thus edge leakage is reduced or eliminated.

In addition, improved methods of adjusting threshold voltage for a semiconductor device fabricated on a SOI substrate have been illustrated that result in reduced threshold voltage variation from device to device. Finally, it can be seen that the new methods illustrated provide these benefits while maintaining processing simplicity inherent in the manufacture of SOI devices.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A method of fabricating a semiconductor device on a semiconductor on insulator substrate comprising the steps of:

providing said semiconductor on insulator substrate, wherein said semiconductor on insulator substrate includes a semiconductor material disposed on an insulator material, and an interface between the semiconductor material and the insulator material;

forming an active area on said semiconductor on insulator substrate, wherein said active area is within the semiconductor material and adjacent a field oxide region;

forming a sacrificial layer overlying said active area;

forming a first dopant profile, wherein said first dopant profile has a peak dopant concentration in a portion of said active area adjacent said field oxide region and the interface between the semiconductor material and the insulator material; and forming a second dopant profile, wherein said second dopant profile has a peak dopant concentration in a channel region of said active area, wherein a concentration of the first dopant profile is greater than a concentration of the second dopant profile.

2. The method of claim 1 wherein the step of providing the semiconductor on insulator substrate further comprises providing a bulk substrate having thereon a buried insulation layer, and further having a semiconductor device layer overlying said buried insulation layer.

3. The method of claim 1 wherein the step of providing the semiconductor on insulator substrate further comprises providing a bulk substrate having thereon a buried insulation layer comprised of silicon oxide, and further having a semiconductor device layer, comprised of silicon, overlying said buried insulation layer.

4. The method of claim 1 wherein the step of forming a first dopant profile comprises implanting boron, phosphorus or arsenic into said active area.

5. The method of claim 1 wherein the step of forming a second dopant profile comprises implanting boron, phosphorus or arsenic into said active area.

6. The method of claim 1 wherein the step of forming a sacrificial layer further comprises forming a sacrificial layer comprised of silicon oxide.

7. A method of adjusting threshold voltage in a semiconductor device fabricated on a semiconductor on insulator substrate comprising the steps of:

providing the semiconductor on insulator substrate, wherein said semiconductor on insulator substrate includes a semiconductor material disposed on an insulator material, and an interface between the semiconductor material and the insulator material;

forming an active area in said semiconductor on insulator substrate, wherein said active area is within the semiconductor material and adjacent a field oxide region;

forming a gate oxide layer on said active area;

depositing a polysilicon layer overlying said gate oxide layer;

forming a first dopant profile, wherein said first dopant profile has a peak dopant concentration in a portion of said active area adjacent said field oxide region; and forming a second dopant profile, wherein said second dopant profile has a peak dopant concentration in a channel region of said active area.

8. The method of claim 7 wherein the step of providing the semiconductor on insulator substrate further comprises providing a bulk substrate having thereon a buried insulation layer comprised of silicon oxide, and further having a semiconductor device layer, comprised of silicon, overlying said buried insulation layer.

9. The method of claim 7 wherein the step of forming a gate oxide layer further comprises forming the gate oxide layer with a thickness between approximately 5 and 40 nm, and the step of forming a polysilicon layer further comprises forming the polysilicon layer with a thickness between approximately 20 nm and 400 nm.

10. The method of claim 7 wherein the step of forming a first dopant profile further comprises forming the first dopant profile with a dopant selected from the group consisting of boron, phosphorus and arsenic.

11. The method of claim 7 wherein the step of forming a second dopant profile further comprises forming the second dopant profile with a dopant selected from the group consisting of boron, phosphorus and arsenic.

12. A method of adjusting threshold voltage and reducing edge leakage in a semiconductor device fabricated on a silicon on insulator substrate, comprising the steps of:

providing the silicon on insulator substrate comprising a device layer, wherein said silicon on insulator substrate includes a semiconductor material disposed on an insulator material, and an interface between the semiconductor material and the insulator material;

forming at least one field oxide region in said device layer to define an active area within the semiconductor material;

forming a gate oxide layer on said active area;

forming a polysilicon layer overlying said gate oxide layer;

patterning said polysilicon layer to form a gate electrode;

forming a source region and a drain region in said active area, wherein said source region and said drain region are self-aligned to said gate electrode;

performing a first threshold adjust implant, wherein a first dopant profile is formed in said silicon on insulator substrate; and performing a second threshold voltage adjust implant, wherein a second dopant profile is formed in said silicon on insulator substrate.

13. The method of claim 12, wherein the step of providing the silicon on insulator substrate comprises providing a bulk substrate having thereon a buried insulator layer, underlying said device layer, comprised of silicon oxide.

14. The method of claim 12, further comprising the step of forming sidewall spacers adjacent said gate electrode.

15. The method of claim 12, wherein the step of forming a source region and a drain region, include forming LDD regions, self-aligned to said gate electrode, in said active area.

16. The method of claim 12, wherein the steps of performing a first threshold adjust implant and a second threshold adjust implant further comprise implanting boron or phosphorus.

17. The method of claim 12, wherein the step of forming a first dopant profile further comprises implanting a dopant at a first implant energy and the step of forming a second dopant profile further comprises implanting a dopant at a second implant energy.

18. The method of claim 12, wherein the step of forming a first dopant profile in said silicon on insulator substrate further comprises forming a peak dopant concentration in a portion of said active area adjacent said at least one field oxide region.

19. The method of claim 12, wherein the step of forming a second dopant profile in said silicon on insulator substrate further comprises forming a peak dopant concentration in a channel region of said active area underlying said gate electrode.

20. A method of fabricating a semiconductor device on a semiconductor on insulator substrate comprising the steps of:

providing the semiconductor on insulator substrate, wherein said semiconductor on insulator substrate includes a semiconductor material disposed on an insulator material, and an interface between the semiconductor material and the insulator material;

forming at least one field oxide region on said semiconductor on insulator substrate, wherein said at least one field oxide region defines an active area within the semiconductor material;

doping said semiconductor substrate wherein a first dopant profile having a peak dopant concentration in a portion of said active area adjacent said field oxide region is formed; and doping said semiconductor substrate wherein a second dopant profile having a peak dopant concentration in a channel region of said active area is formed.

* * * * *